US005583817A

United States Patent [19]

Kawaguchi et al.

[11] Patent Number: 5,583,817

[45] Date of Patent: Dec. 10, 1996

[54] SEMICONDUCTOR INTEGRATED CIRCUIT DEVICE

[75] Inventors: Etsuko Kawaguchi, Hamura; Keiichi Higeta; Yasuhiro Fujimura, both of Ohme; Kunihiko Yamaguchi, Sayama, all of Japan

[73] Assignee: Hitachi, Ltd., Tokyo, Japan

[21] Appl. No.: 382,592

[22] Filed: Feb. 2, 1995

[30] Foreign Application Priority Data

Feb. 2, 1994 [JP] Japan .................................... 6-030926

[51] Int. Cl.[6] .................................................... H01L 27/10

[52] U.S. Cl. .......................... 365/201; 365/190; 365/202; 365/189.05; 365/189.07

[58] Field of Search .................................... 365/200, 201, 365/190, 202, 189.05, 189.01, 189.07

[56] References Cited

U.S. PATENT DOCUMENTS 5,276,648 1/1994 Yanagisawa ............................ 365/201
5,301,142 4/1994 Suzuki et al. ........................... 365/201
5,311,476 5/1994 Kajimoto et al. ........................ 365/222
5,359,561 10/1994 Sakomura et al. ...................... 365/201

FOREIGN PATENT DOCUMENTS 62-275386 11/1995 Japan .

*Primary Examiner*—Viet Q. Nguyen
*Attorney, Agent, or Firm*—Antonelli, Terry, Stout & Kraus

[57] ABSTRACT

Read signals to be outputted in the unit of bits from a packaged RAM are received to produce complementary output signals, and these output signals and the non-inverted and inverted signals of expected values are individually inputted to two logic circuits, so that the outputs of the logic circuits are compared by a coincidence/incoincidence circuit to produce a decision output.

17 Claims, 11 Drawing Sheets

SEMICONDUCTOR INTEGRATED CIRCUIT DEVICE

BACKGROUND OF THE INVENTION

The present invention relates to a semiconductor integrated circuit device and, more particularly, to a technique which is effective when applied to a testing technique in a semiconductor integrated circuit device such as a gate array having a RAM (i.e., Random Access Memory, as will be shortly referred to as the "RAM") packaged therein.

A conventional testing technique of a packaged RAM is disclosed in Japanese Patent Laid-Open No. 170100/1987, for example. This semiconductor integrated circuit device is equipped with a selector for preventing an increase in the number of diagnosis terminals, so that the output of the packaged RAM is selected by the selector and outputted from the LSI (or semiconductor integrated circuit device).

SUMMARY OF THE INVENTION

In the conventional technique for testing a semiconductor integrated circuit device, the output of the packaged RAM is selected by the selector and outputted to be decided as an expected value by an IC tester. Thus, there arises a problem that the number of activations for the RAM test is so large as to significantly elongate the testing time period. If, on the other hand, a comparison is made for each data by providing the inside of the LSI with a decision circuit for making a decision with the expected value, there arises another problem that the circuit area and the current consumption are increased.

An object of the present invention is to provide a semiconductor integrated circuit device which can shorten the test time period of a packaged RAM with a simple construction.

Another object of the present invention is to provide a semiconductor integrated circuit device which is equipped with a highly reliable decision circuit.

The aforementioned and other objects and novel features of the present invention will become apparent from the following description to be made with reference to the accompanying drawings.

The summary of a representative of the invention to be disclosed hereinafter will be briefly described in the following. Specifically, read signals to be outputted at the unit of bits from a packaged RAM are received to produce complementary output signals, and these output signals and the non-inverted and inverted signals of expected values are individually inputted to two logic circuits, so that the outputs of the logic circuits are compared by a coincidence/incoincidence circuit to produce a decision output.

According to the above-specified means, the output signals from the RAM can be decided in the unit of the plurality of bits in a batch together with the expected values, and the semiconductor integrated circuit device can be constructed with only one diagnosis output pin.

DESCRIPTION OF THE PREFERRED EMBODIMENTS

Figure 3:
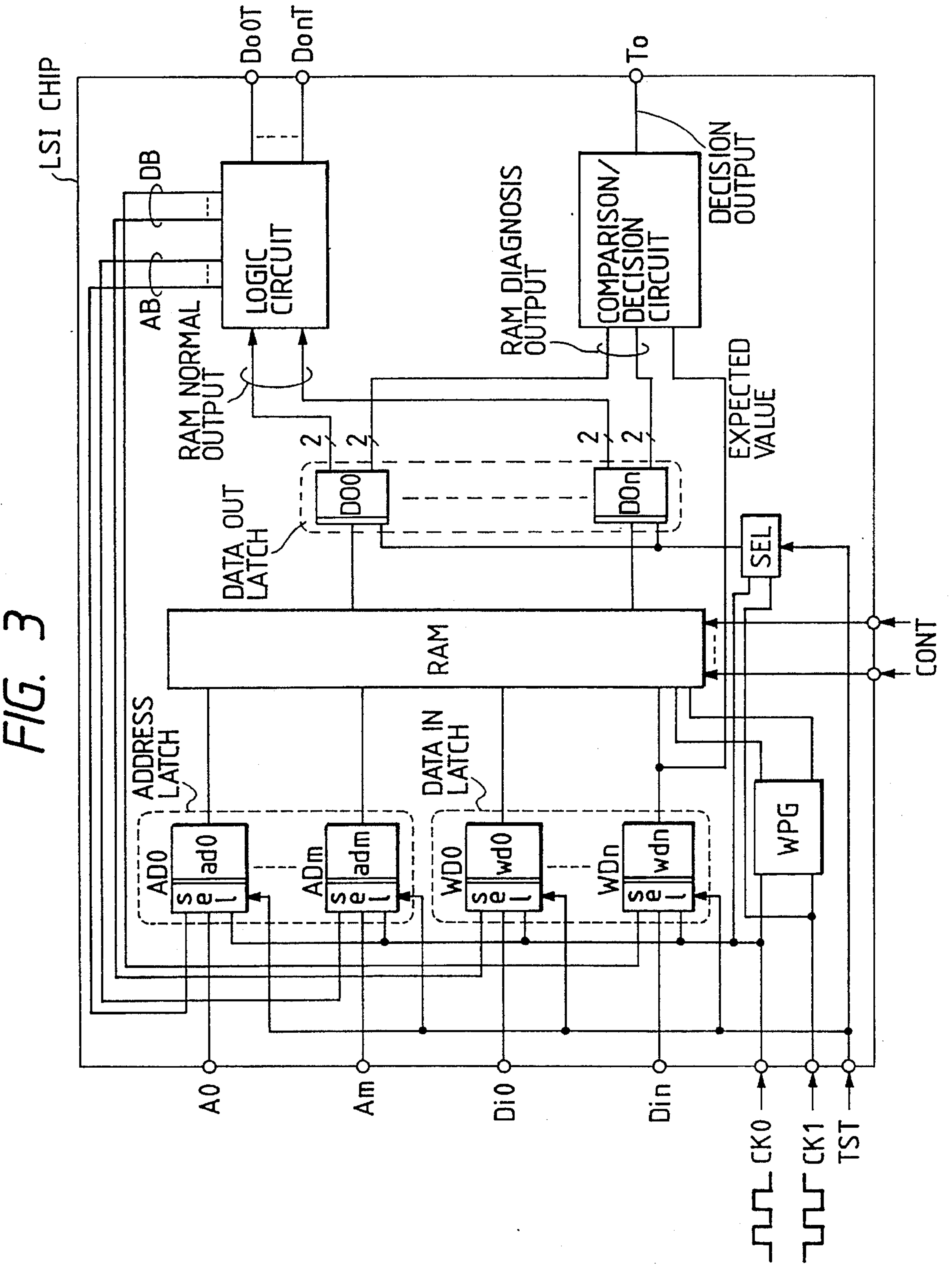
FIG. 3 is a schematic block diagram showing one embodiment of the semiconductor integrated circuit device according to the present invention.

FIG. 3 is a schematic block diagram showing one embodiment of the semiconductor integrated circuit device according to the present invention. The circuit block, as shown, is formed over one semiconductor substrate made of single crystalline silicon by the well-known semiconductor integrated circuit manufacturing technique. The semiconductor integrated circuit device of this embodiment comprises a memory circuit RAM and a logic circuit for logically processing the stored information of the former. In short, the semiconductor integrated circuit device of this embodiment is a specially applied LSI which is constructed of a RAM of gate array or standard cell type and a logic circuit. This logic circuit is composed of OR and/or AND circuits. The semiconductor integrated circuit device operates on the basis of two-phase external clocks CK0 and CK1. Of these, the external clock CK1 is a clock signal having its phase shifted by 180 degrees, from the external clock CK0. The phase shift of the clock CK1 should not be limited to 180 degrees, but can be arbitrarily set. A write pulse generator WPG receives the two-phase external clocks CK0 and CK1 to generate internal clock signals.

Although the invention is not limited to this, address signals fed from address inputting external terminals A0 to Am are fetched in address latches AD0 to ADm in synchronism with the clock signal CK0 (i.e., the rising timing). Write data-inputted from data-inputting external terminals Di0 to Din are also fetched in data-in latches WD0 to WDn in synchronism with the clock signal CK0. The RAM decodes the aforementioned address signals to select the memory cells corresponding to the (n+1) number of bit complementary data lines, and writes, if in the writing operation, the data fetched in the aforementioned data-in latches WD0 to WDn. If in the reading operation, the RAM outputs the read signals from the aforementioned selected memory cells to data-out latches DOn to DOn. In the RAM, the internal clock signals generated by the write pulse generator are controlled on the basis of a control signal CONT coming from the outside. In the ordinary operation mode (in which a test signal TEST is at the low level), the output signals of the aforementioned data-out latches DO0 to DOn are inputted to and processing by the logic circuit.

Incidentally, in the test mode (in which the test signal TEST is at the high level), a selector SEL selects the output of the clock signal CK1, and the data-out latches DO0 to DOn input and output the data-in synchronism with the clock signal CK1.

In this embodiment, there is provided a comparison/decision circuit for effecting the testing of the aforementioned RAM for a short time period. The aforementioned data-out latches DO0 to DOn are equipped with a testing output circuit. This output circuit outputs two signals composed of a non-inverted output (i.e., a positive signal P) and an inverted output (i.e., a negative signal N). Of the data-in latches, on other hand, the specific data-in latch WDn is fed with an expected value to input its output signal to the aforementioned comparison/decision circuit.

The comparison/decision circuit inputs not only the non-inverted output P and inverted output N of (n+1) bits from the aforementioned data-out latches but also their corresponding complementary expected values to the logic circuit, to output a coincidence/incoincidence decision signal to the external terminals. The aforementioned comparison/decision circuit decides the all 0 or all 1 of all inputs.

The address latches AD0 to ADm and the data-in latches WD0 to WDn have input terminals fed directly with address signals and write data from the external terminals and have input terminals fed with address signals and write data produced by the internal logic circuit. Specifically, the address latches or the data-in latches of the RAM have the input terminals coupled with an address bus AB or a data bus DB formed in the semiconductor integrated circuit.

The address latches AD0 to ADm have the selector circuits sel and the address hold circuit ad0 to adm, and the data-in latches WD0 to WDn have the selector circuits sel and the data hold circuit wd0 to wdn. Each of the selector circuits sel selects address signals and write data from one of the external terminals and the internal logic circuit, in accordance with the test signal TEST supplied from a test signal input terminal, and selected address signals and write data are provided to the address hold circuits ad0 to adm and to the data hold circuits wd0 to wdn. When the test signal TEST of the low level "0" is supplied to the selector circuits sel, the address hold circuits ad0 to adm and the data hold circuits wd0 to wdn latch the address signals and the write data from the internal logic circuit. And when the test signal TEST of the high level "1" is supplied to the selector circuits sel, the address hold circuits ad0 to adm and the data hold circuits wd0 to wdn latch the address signals and the write data from the external terminals.

The test signal TEST supplied to each of the selector circuits sel may be provided an another terminal which is different from the test signal input terminal.

Figure 10A:
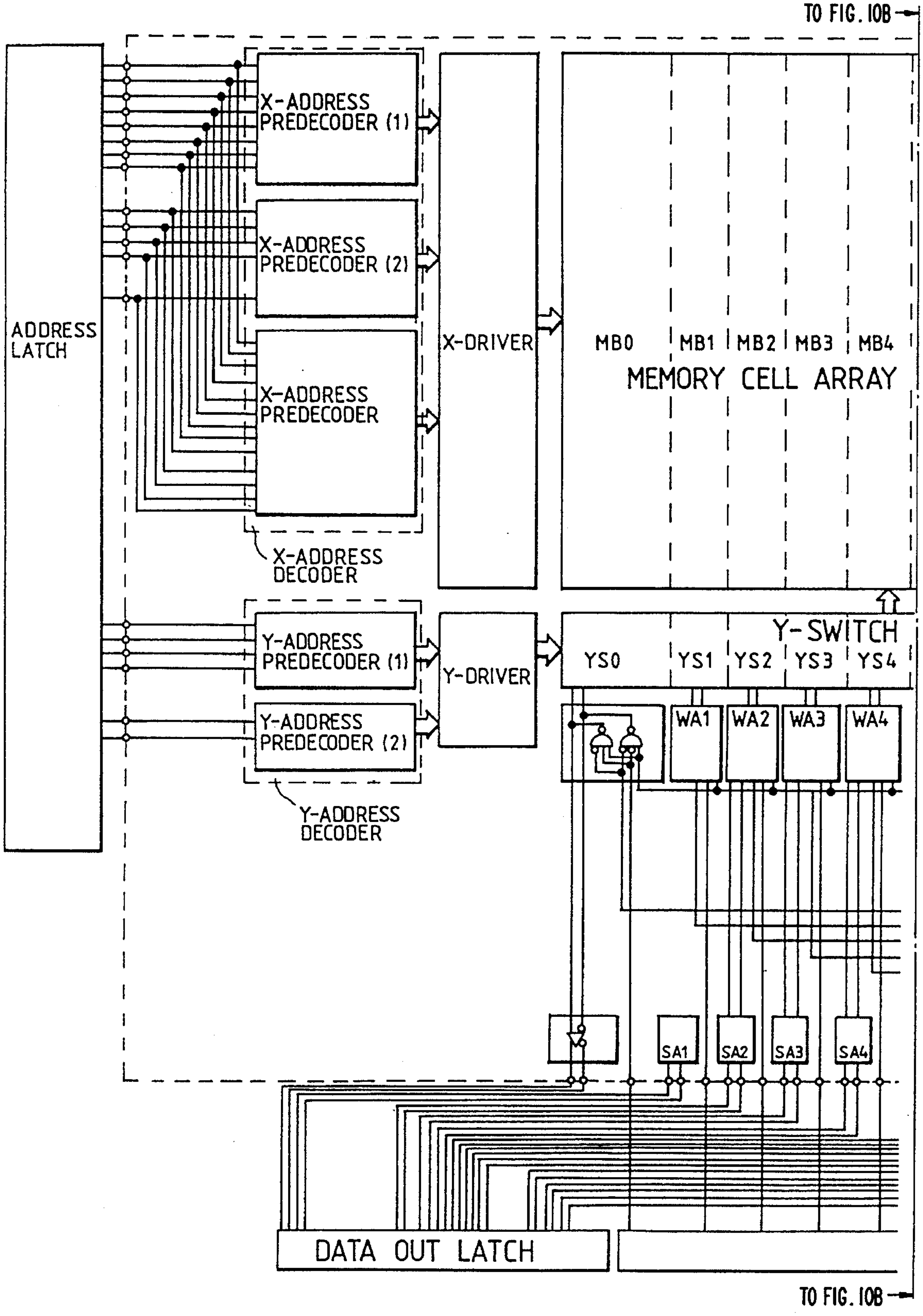
FIG. 10 is an internal block diagram of the packaged RAM.
Figure 10B:
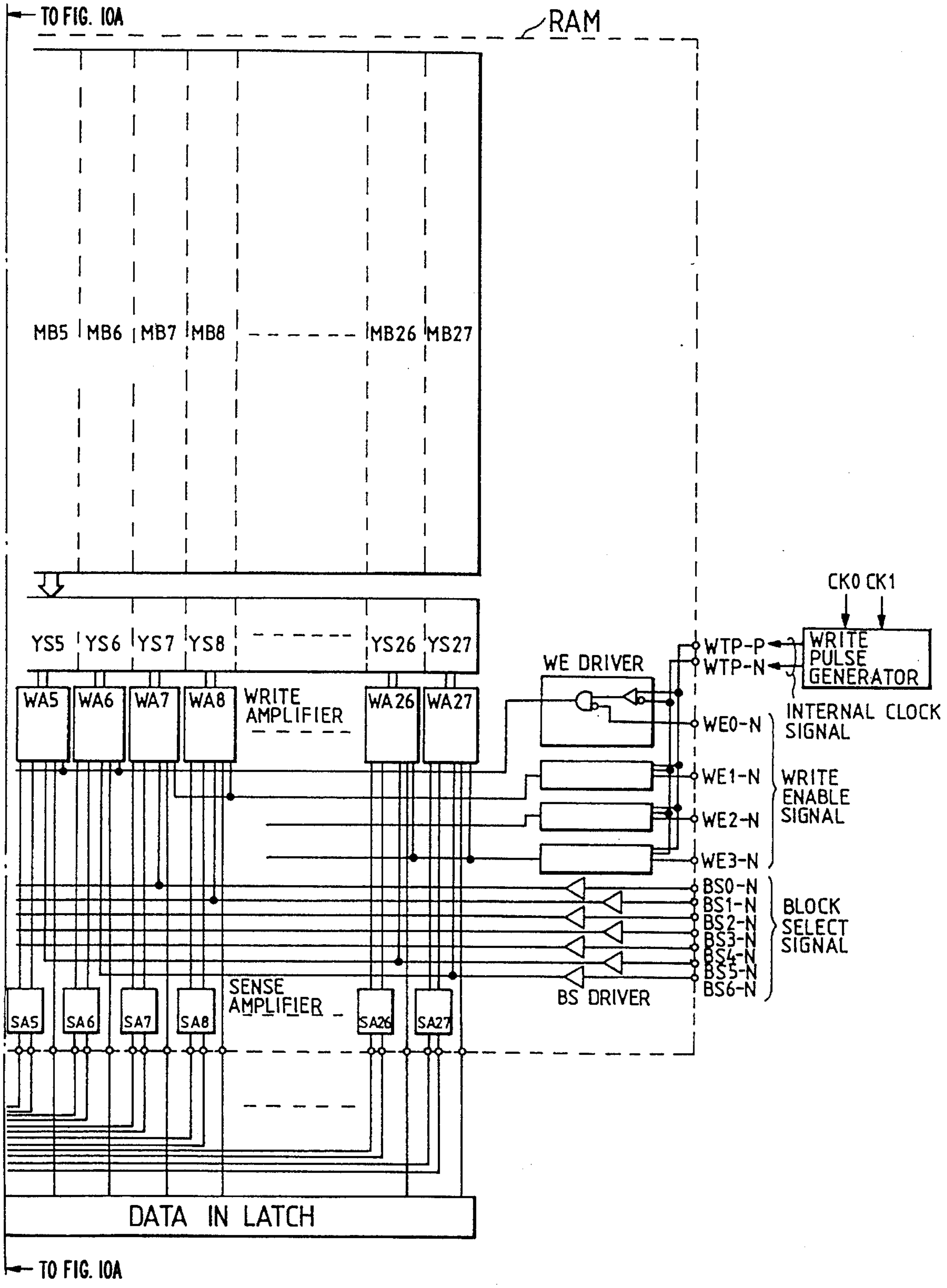

FIG. 10 is an internal block diagram of the memory circuit RAM. A memory array is divided into eight memory blocks MB0 to MB27. Each memory block is equipped with a plurality of word lines, a plurality complementary data lines and a plurality of memory cells. A plurality of Y-switches are provided for each complementary data line, and a read sense amplifier and a write amplifier are provided for each memory block. The address signal fed from the address latch is fed to X-address decoders (i.e., X-address predecoders 1 and 2 for redundancy) and Y-address decoders (i.e., Y-address predecoders 1 and 2), and the plurality of Y-switches and one word line for selecting the complementary data lines one by one from each memory block are selected by an X-driver and a Y-driver. A write enable signal and a block select signal are fed as the control signal CONT from the outside, as shown in FIG. 3. The data latched in a data-in latch are fed to corresponding write amplifiers WA0 to WA27 and further through the selected Y-switches to the individual complementary data lines. When (in the write mode) the write amplifiers WA0 to WA27 are individually fed with write enable signals WE0-N to WE3-N at the low level "0" as a portion of the control signal CONT, the data fed from the data-in latch can be fed to the memory cells in the memory block. When (in the read mode) the write amplifiers WA0 to WA27 are individually fed with the write enable signals WE0-N to WE3-N at the high level "1", the data fed from the data-in latch cannot be fed (because of the high impedance state) to the memory cells in the corresponding memory block. Moreover, the write amplifiers WA0 to WA27 are individually made effective or ineffective to write the data in the corresponding memory blocks by block select signals BS0-N to BS6-N fed as a portion of the control signal CONT. In case, for example, the block select signal BS0 at the low level "0" is fed to the write amplifier WA0, the write amplifier WA0 feeds the data from the data-in latch to the memory block MB0. In case, however, the block select signal BS0 at the high level "1" is fed to the write amplifier WA0, the write amplifier WA0 does not feed the data from the data-in latch to the memory block MB0. Similar discussions can be made at write amplifiers WA1 to WA27. Read sense amplifiers WA1 to WA27 amplify the data, which are read out from the memory cells selected by the address signals fed to the X-address decoder and the Y-address decoder, and feed the amplified data to the date-out latch. The data writing and reading operations are executed in accordance with the internal clock signal which is generated by a write pulse generator WPG.

As shown in FIG. 10, the write enable signals are fed to the write amplifiers WA but should not be limited thereto. The write enable signals may be directly fed to the write pulse generator WPG to execute the writing operations and the reading operations of the memory circuits.

Figure 1:
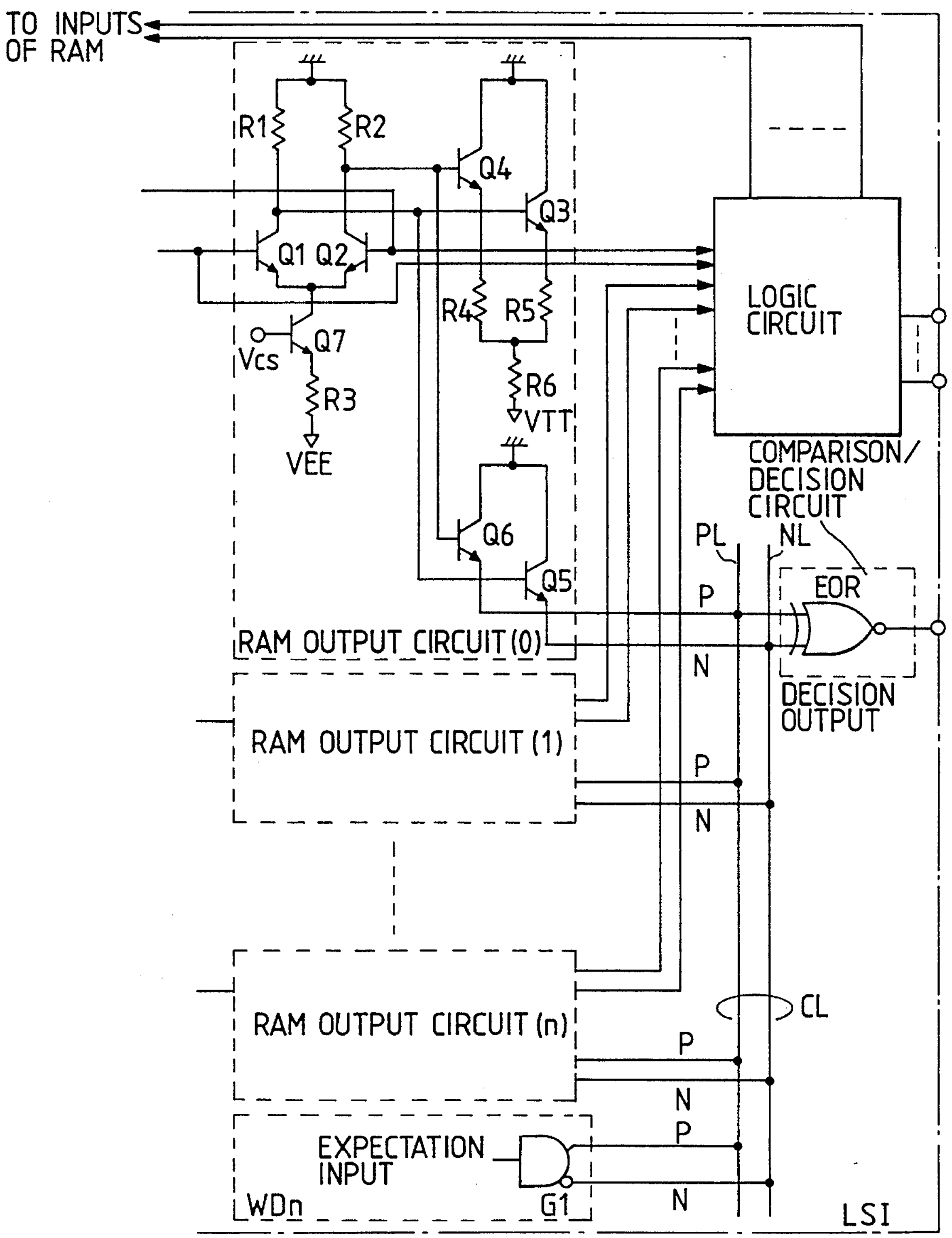
FIG. 1 is a circuit diagram showing one embodiment of the output portion of a data-out latch to be disposed in a packaged RAM of a semiconductor integrated circuit device according to the present invention, and a comparison/decision circuit.

FIG. 1 is a circuit diagram showing one embodiment of the output portion and the comparison/decision circuit of the aforementioned date-out latch. Of the aforementioned output signals of (n+1) bits, a specific circuit of one output circuit is representatively shown by way of example in FIG. 1. In this embodiment, the output circuit is constructed of an ECL (i.e., Emitter Coupled Logic).

The RAM output circuit (0) is constructed of an ordinary outputting unit and a testing unit. The later-described latch circuit has its output signal fed to the base of a differential transistor Q1. A transistor Q2 connected in a differential shape with the transistor Q1 has its base fed with a reference voltage. The differential transistors Q1 and Q2 are equipped with load resistors R1 and R2. The differential transistors Q1 and Q2 have their common emitter equipped with a transistor Q7 acting as a constant current source. This transistor Q7 has its base fed with a constant voltage VCS and its emitter equipped with an emitter resistor R3 to establish a constant current.

The aforementioned differential transistors Q1 and Q2 have their collector output fed at one hand to the bases of emitter-follower output transistors Q3 and Q4. Between the emitters of those transistors Q3 and Q4 and a voltage terminal VTT, there are connected load resistors R4, R5 and R6, so that the emitters of those transistors Q3 and Q4 feed the non-inverted (or positive) and inverted (or negative) complementary signals as their ordinary outputs to the logic circuit or the next stage circuit. The output signals of other similar RAM output circuits (1) to (n) are also inputted to the aforementioned logic circuit.

This embodiment is equipped as the testing output circuit with emitter-follower transistors Q5 and Q6 for receiving the collector outputs of the aforementioned differential transistors Q1 and Q2. The inverted output N is outputted from the emitter of the output transistor Q5 corresponding to the output of the aforementioned transistor Q1, and the non-inverted output P is outputted from the emitter of the output transistor Q6 corresponding to the collector output of the transistor Q2. Similar complementary signals are also outputted from similar testing output circuits of the remaining RAM output circuits (1) to (n). In order to take an OR between the non-inverted signal P and the inverted signal N of the aforementioned complementary output signals, the corresponding emitters of the aforementioned output transistors are commonly connected. Specifically, in the non-inverted signal line PL and the inverted signal line NL of common complementary data lines CL, a wired OR logic is taken between the non-inverted signal line P and the inverted signal line N of each of the RAM output circuits (0) to (n) and the data line latches WDn.

The expected value latched in the aforementioned data-in latch WDn is fed to a gate circuit G1. The gate circuit G1 is constructed of: a differential circuit composed of the aforementioned differential transistors Q1 and Q2, collector resistors R1 and R2 and constant current source transistor Q7; and a circuit similar to that of output transistors Q5 and Q6, to have its complementary output signals wired in the OR form with the aforementioned memory output.

The two wired logic signals of the aforementioned non-inverted signal P and inverted signal N are fed to an exclusive OR circuit acting as the coincidence/incoincidence circuit. This exclusive OR circuit EOR has its output fed as a decision output from the external terminals of the semiconductor integrated circuit device LSI.

When the data read out from the RAM are all at 0 (i.e., the low level) so that the corresponding expected value is at 0, all the (n+1) bits outputted from the RAM output circuits (0) to (n) and the expected value are given the low level. In short, the data of the (n+1) bits and the non-inverted signal P of 1 bit of the expected value are given the low level, whereas the inverted signal N is given to the high level. If all the bits are at 0, the wired logic output at the non-inverted side P takes the low level whereas the wired logic output at the inverted side N takes the high level. As a result, the exclusive OR circuit EOR outputs a pass signal at the low level (0) because the two inputs take the low level and the high level.

If an incoincidence exists in even 1 bit, it means that a high level is present at the non-inverted signal side P to be set to the aforementioned low level, and the wired logic output of the non-inverted side P is raised to the high level. Thus, the exclusive OR circuit EOR is fed both its inputs with the high level, to output a fail signal of the high level (1).

When the data read out from the RAM are all at the (high level) 1 so that the corresponding expected value is at 1, all the (n+1) bits outputted from the RAM output circuits (0) to (n) and the expected value are given the low level. In short, the data of the (n+1) bits and the non-inverted signal P of 1 bit of the expected value are given the high level, whereas the inverted signal N is given to the low level. If all the bits are at 1, the wired logic output at the non-inverted side P takes the high level whereas the wired logic output at the inverted side N takes the low level. As a result, the exclusive OR circuit EOR outputs a pass signal at the low level (0) because the two inputs are incoincident to take the high level and the low level.

If an incoincidence exists in even 1 bit, it means that a high level is present at the inverted signal side N to be set to the aforementioned low lev e1, and the wired logic output of the inverted side N is raised to the high level. Thus, the exclusive OR circuit EOR is fed both its inputs with the high level, to output a fail signal of the high level (1). The following table 1 is a truth value table enumerating the expected values, the logic outputs at the non-inverted side and the inverted side N, and the decided outputs:

TABLE 1

| Expected Value | P Logic Output | N Logic Output | Decided Output |
|---|---|---|---|
| 0 | 0 | 0 | 0 (Pass) |
| 0 | 1 | 1 | 1 (Fail) |
| 1 | 1 | 0 | 0 (Pass) |
| 1 | 1 | 1 | 1 (Fail) |

In this embodiment, the coincidence/incoincidence are decided including the expected values so that a highly reliable decision result can be achieved. If the pass/fail are decided without any comparison with the expected values, as described above while awaiting that all the read signals are 0 or 1, such a failure, if occurs, cannot be found out that all 0 or all 1 may always be outputted due to the failure in the address selection of the RAM, the read signal path or the output circuit.

Figure 2:
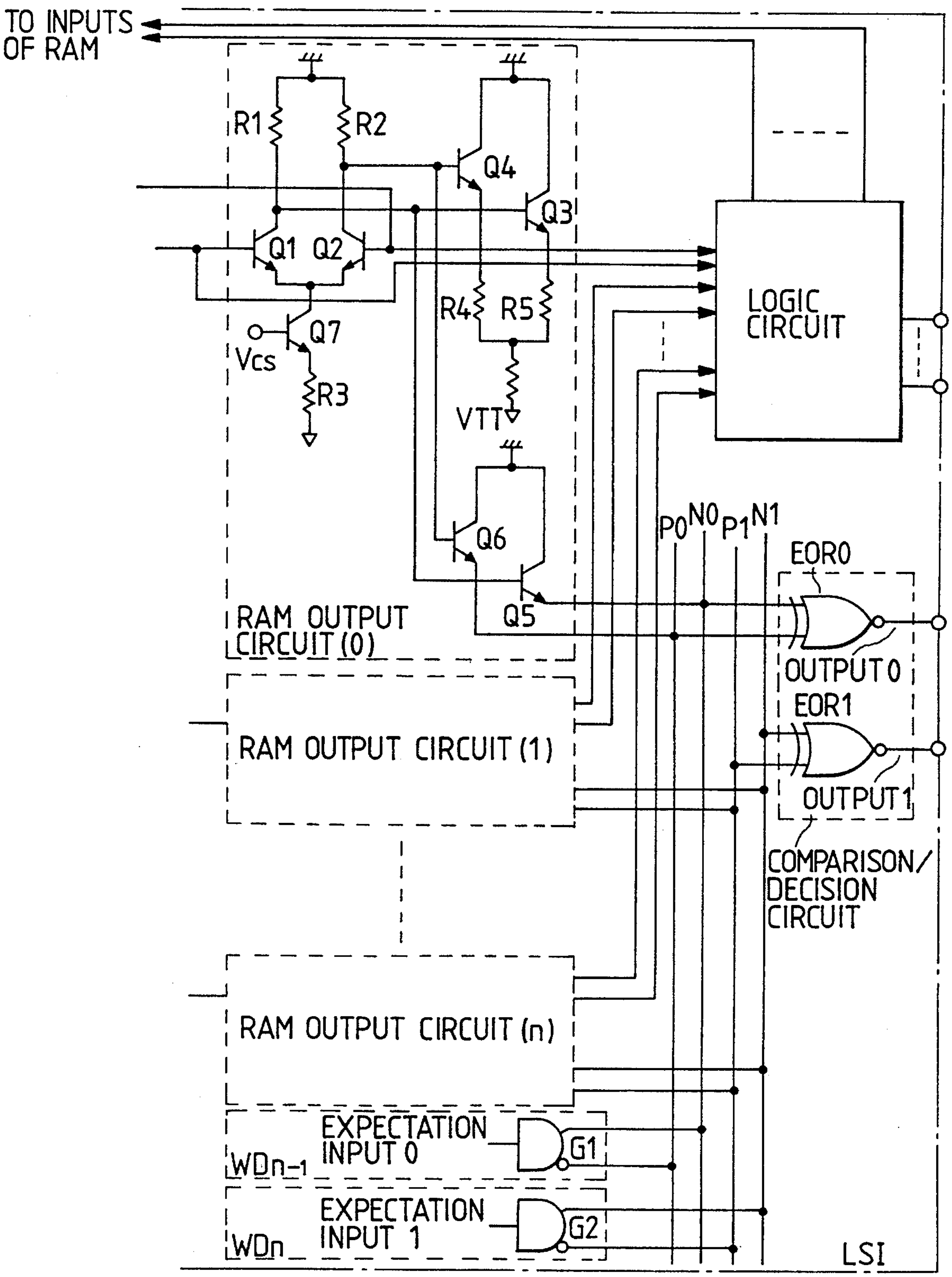
FIG. 2 is a circuit diagram showing another embodiment of the output portion of the data-out latch to be disposed in the packaged RAM of the semiconductor integrated circuit device according to the present invention, and the comparison/decision circuit.

FIG. 2 is a circuit diagram showing another embodiment of the output portion of the aforementioned date-out latch and the comparison/decision circuit. In FIG. 2, there is representatively shown a specific circuit of one output circuit for the output signals of (n+1) bits as in FIG. 1.

In this embodiment, the (n+1) bits are divided into the two, the individual testing outputs of which are constructed into the wired OR logics such as P0 and N0, and P1 and N1 so that they are inputted to two exclusive OR circuits EOR0 and EOR1. These exclusive OR circuits EOR0 and EOR1 output the decision output 0 and the decision output 1.

In a manner to correspond to the aforementioned division of the output signal, there are provided the expectation inputs 0 and 1. These expectation inputs 0 and 1 do not mean the signal levels such as the logic 0 or logic 1 but correspond to the aforementioned halved wired OR logics P0 and N0, and P1 and N1. By thus halving the output signal, the decision of the output patterns, in which one signal is all 0 whereas the other is all 1, are carried out by a batch.

Figure 7:
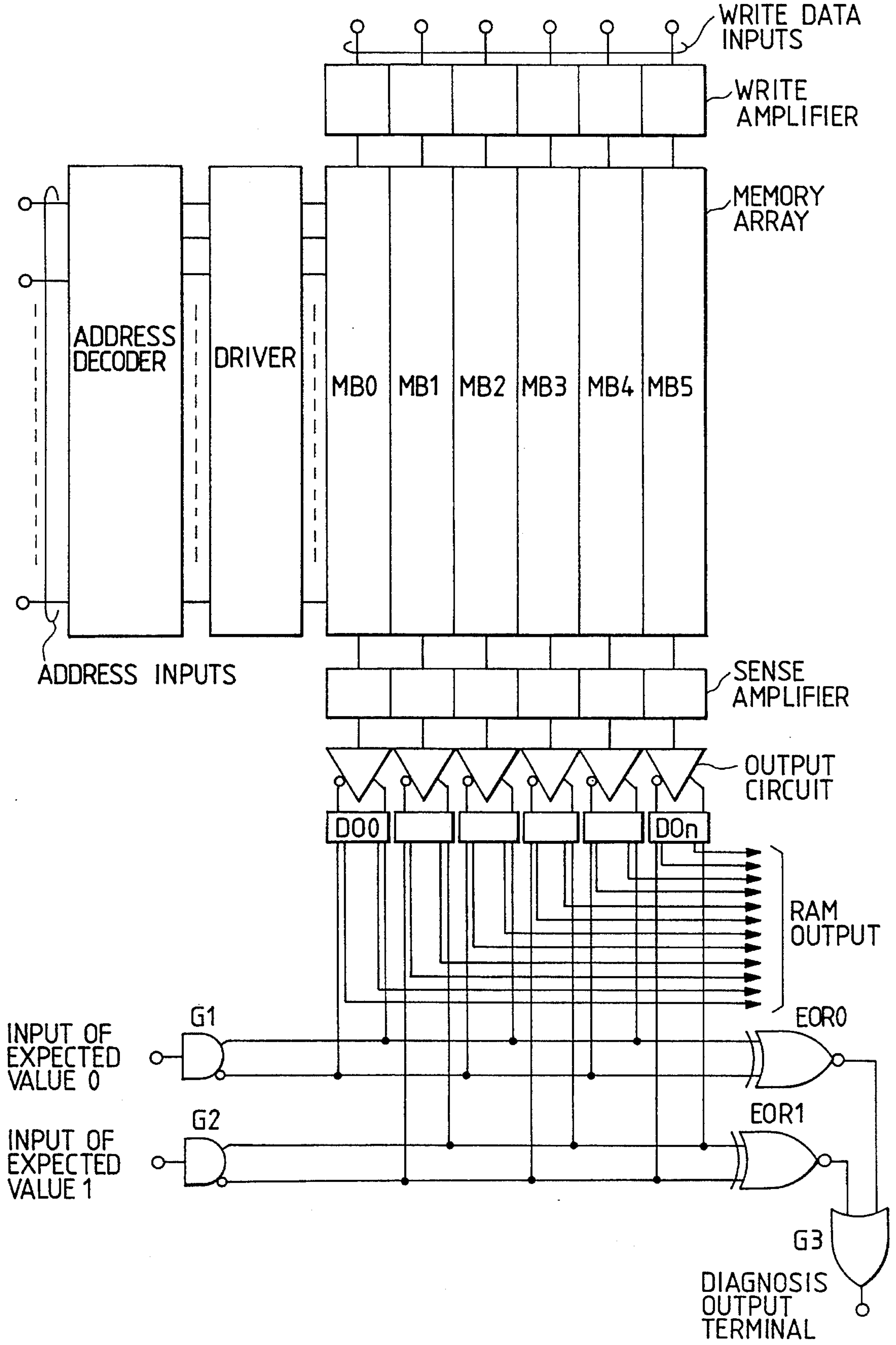
FIG. 7 is a circuit diagram showing one embodiment of a RAM to be packaged in the semiconductor integrated circuit device according to the present invention, and the comparison/decision circuit therefor.

FIG. 7 is a block diagram showing one embodiment of the RAM packaged in the semiconductor integrated circuit device according to the present invention, and the comparison/decision circuit therefor. This embodiment is shown in the entire block diagram corresponding to that of the embodiment of FIG. 2.

The memory array is divided into the memory blocks (or memory mats) MB0 to MB5. The address decoder decodes the address inputs to produce select signals for the word lines and the data lines of the memory array. In other words, the address decoder includes an X-decoder for producing the word line select signals and a Y-decoder for producing the data line select signals. The select signals thus produced by the aforementioned address decoder are fed through the driver to the select switch circuit of the word lines and data lines of the memory array.

The write amplifier receives the write data from the data-in latches WD0 to WDn (n=5 in the shown embodiment) to write the memory cells of the selected one of memory blocks MB0 to MB5. In short, the RAM of this embodiment writes the data at the unit of 6 bits.

The sense amplifier senses the stored information of the individually selected one memory cell of each of the memory blocks MB0 to MB5 and transmits the sensed information to the output circuit. As a result, the RAM of this embodiment accomplishes the data reading operations at the unit of 6 bits as in the writing operations.

The date-out latches DO0 to DO6 are equipped with ordinary outputting output circuits and testing output circuits. The output signals having passed through the ordinarily outputting circuits are inputted as the RAM outputs to the not-shown logic circuits or the like. The testing output signals are divided into two groups. In this embodiment, the adjoining memory blocks are divided into the two so as to examine the signal interference between the adjoining bits. The memory blocks MB0, MB2 and MB4 are made to belong to one group so that they are given the wired OR construction together with the expectation input 0. The memory blocks MB1, MB3 and MB5 are made to belong to one group so that they are given the wired OR construction together with the expectation input 1.

The individual wired OR logic signals of the non-inverted signals and the inverted signals divided into the aforementioned two groups are fed to the exclusive OR circuits EOR0 and EOR1. Moreover, the outputs of the exclusive OR circuits EOR0 and EOR1 are fed not as they are as the decide outputs to the outside but through an OR circuit G3 from one diagnosis output terminal.

Figure 8:
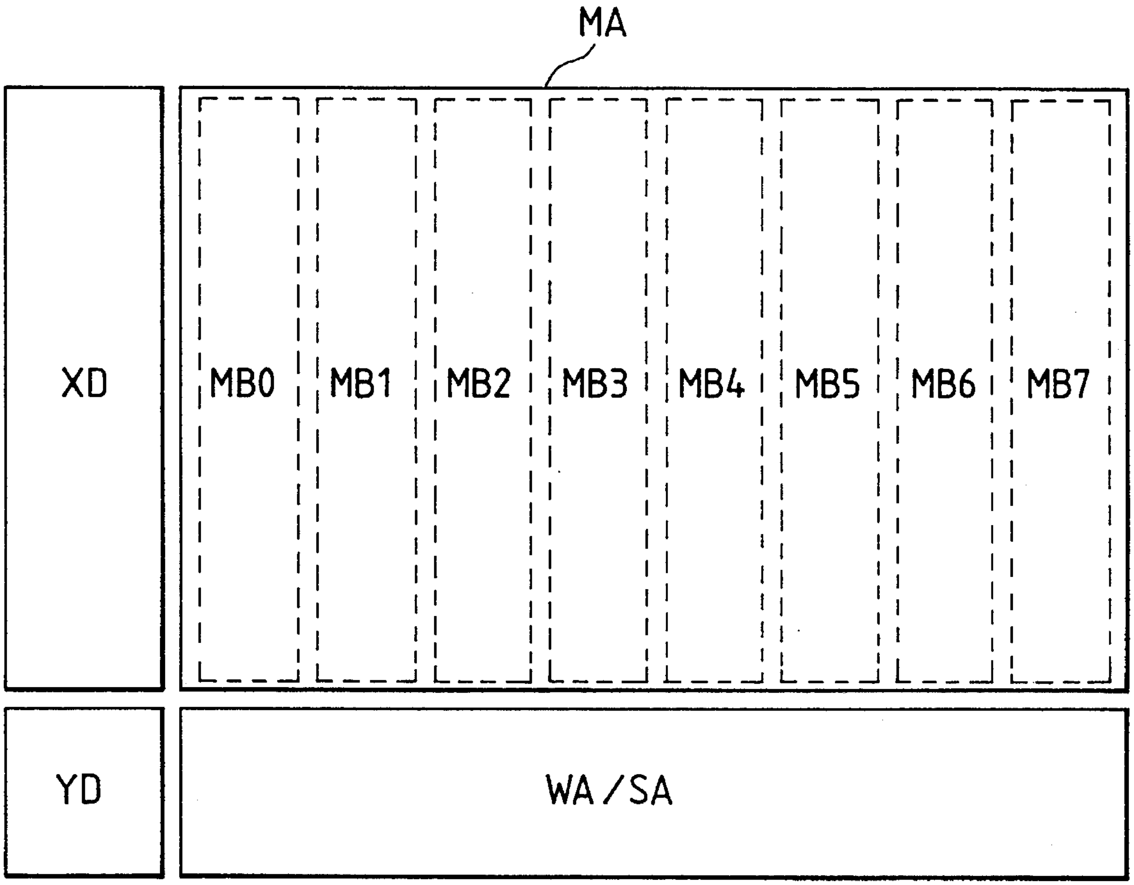
FIG. 8 is a schematic block diagram showing one embodiment of the packaged RAM to which is applied the present invention.

FIG. 8 is a schematic block diagram showing one embodiment of the memory circuit RAM, to which is applied the present invention. FIG. 8 has its individual circuit blocks drawn in conformity with the geometric arrangement on the semiconductor chip. A memory array MA is divided into eight memory blocks MB0 to MB7. The memory access is so carried out at the unit of 8 bits as to select one memory cell from each of the memory blocks MB0 to MB7. Specifically, at the lefthand end of the memory array MA, there is disposed an X-decoder XD. This X-decoder XD is equipped at its output portion with the aforementioned driver for selecting one word line shared among the memory blocks MB0 to MB7. Below the memory array MA, there are arranged the sense amplifier SA and the write amplifier WA. A column switch is disposed in the input portion of the sense amplifier SA and in the output portion of the write amplifier WA so that it is fed with the select signal produced by the Y-decoder YD. Each of the memory blocks MB0 to MB7 has a plurality of data lines, one of which is selected by the aforementioned column switch.

Figure 9:
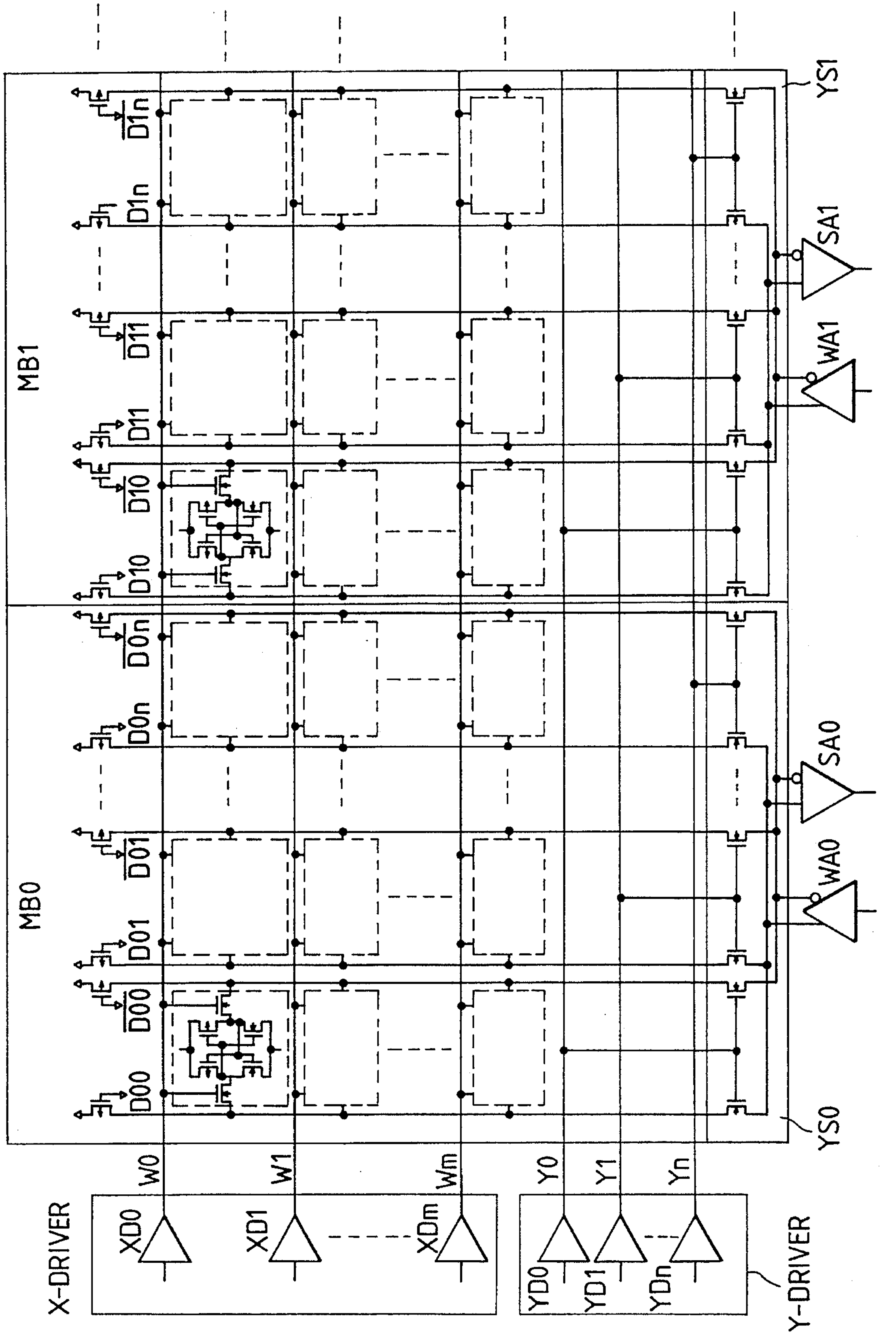
FIG. 9 is a circuit diagram showing one embodiment of the memory block of FIG. 8.

FIG. 9 is a circuit diagram showing one embodiment of the aforementioned memory block of FIG. 10. In FIG. 9, there are representatively shown two memory blocks corresponding to the memory blocks MB0 and MB1.

The memory cell is constructed of: a latch circuit composed of two CMOS inverter circuits made of P-channel type MOSFETs and N-channel MOSFETs and having their inputs and outputs crossly connected; and a transmission gate MOSFETs made of N-channel MOSFETs connected between the paired inputs and outputs and complementary data lines. In short, the memory cell used is of the static type having the CMOS construction. The aforementioned transmission gate MOSFETs have their gates connected with the word line W0. The paired input/output nodes of the memory cell are connected with complementary data lines D00 and /D00. Here, the symbol "/(slush)" represents an over bar indicating the inversion of data lines, as appearing in the drawing.

One memory block MB0 is equipped with (n+1) pairs of complementary data lines D00 and /D00 to DOn and /DOn. These complementary data lines D00 and /D00 to DOn and /D0n are equipped with load MOSFETs acting as resistor elements. The complementary data lines D00 and /D00 to D0n and /D0n are made common through the switch MOSFETs acting as the column switches and are connected with the output terminals of the write amplifier WA0 and the input terminals of the sense amplifier SA0. In the writing operations, the write amplifier WA0 is activated to transmit the write data to the paired complementary data lines selected, so that the word lines write the data in the selected memory cells.

When in the reading operations, the write amplifier WA0 is brought into the output high-impedance state the signals of that pair of complementary data lines, which is selected by Y-select signals Y0 to Yn from the complementary data lines having received the read signals from the memory cells selected by the word lines, are fed to the sense amplifier. The signals read out from the aforementioned CMOS static type memory cells are differentially amplified by the sense amplifier so that they are converted into the ECL level and transmitted to the output circuit. On the other hand, the write data at the ECL level are converted into the CMOS level by the write amplifier WA so that they are transmitted as the aforementioned write signals to the complementary data lines. The RAM, which is constructed of the memory cells of the CMOS construction and the peripheral circuit having the ECL interchangeability, is well known in the prior art so that its detailed description will be omitted.

Not only the memory block MB1 exemplified as another representative but also the not-shown other memory blocks MB2 to MB7 are also given construction similar to the aforementioned one to effect the writing or reading operations. Thus, the memory access is accomplished at the unit of 8 bits in its entirety.

In the cache memory, because of a small address length, one memory array is constructed of the divided memory blocks MB0 to MB7, as has been described with reference to FIG. 8. This makes it necessary to test the presence and absence of a failure due to the short-circuit and crosstalk noise between the data. By applying the embodiment of FIG. 7, therefore, the test can be accomplished by using the different data on the adjoining circuits on the layout. In other words, one group is composed of the memory blocks MB0, MB2, MB4 and MB6, and the other group is composed of the memory blocks MB1, MB3, MB5 and MB7, so that the expectation inputs 0 and 1 are individually assigned to the two groups.

By this grouping, in the embodiment of FIG. 9, it is possible to examine the data interference between the data line/D0n of the memory block MB0 and the data line D10 of the memory block MB1 adjoining the former, and the interference between the sense amplifiers SA0 and SA1 or between the signal lines of the write amplifiers WA0 and WA1.

Figure 4:
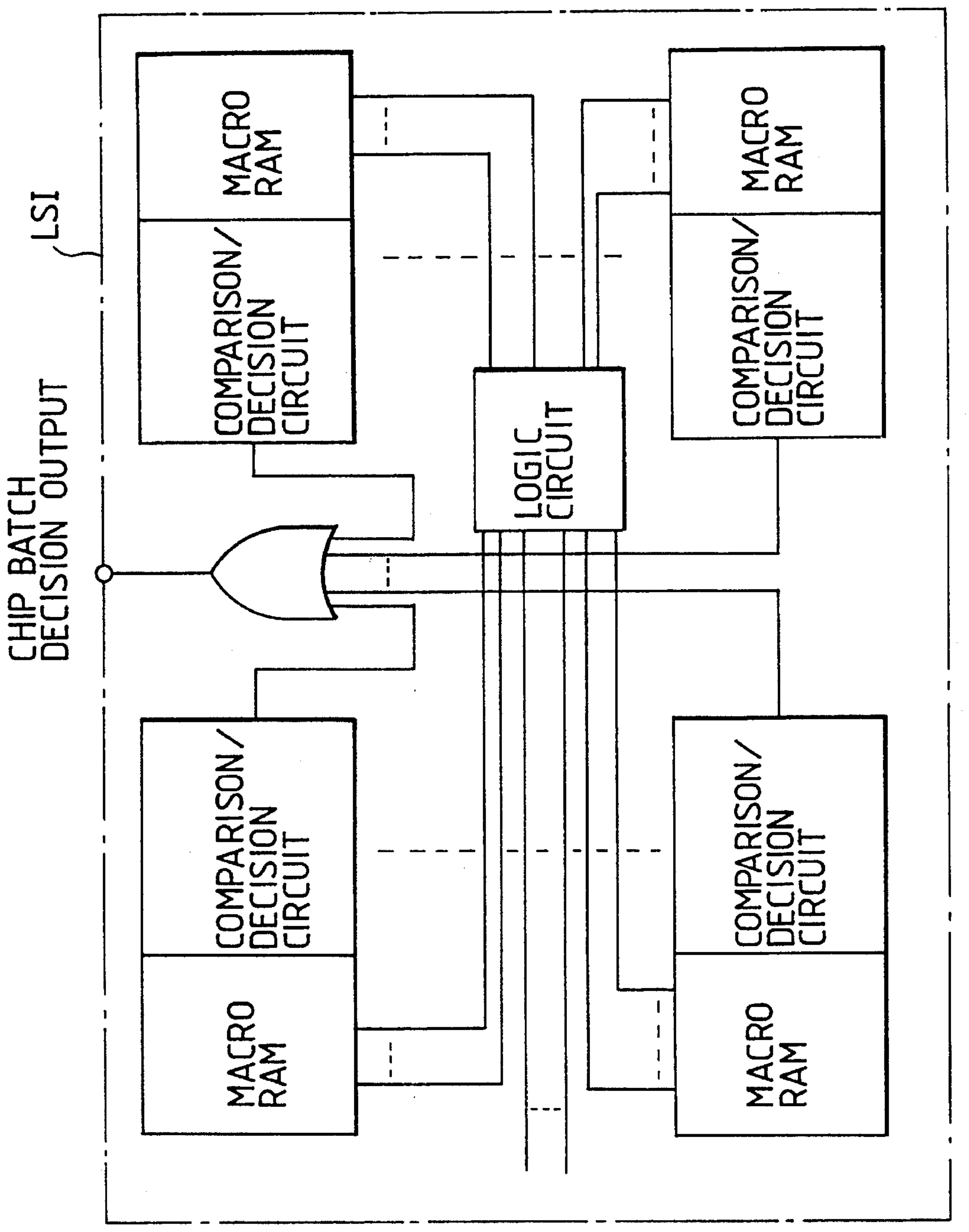
FIG. 4 is a schematic block diagram showing another embodiment of the semiconductor integrated circuit device according to the present invention.

FIG. 4 is a schematic block diagram showing another embodiment of the semiconductor integrated circuit device according to the present invention. In the semiconductor integrated circuit device of this embodiment, there are mounted a plurality of macro RAMs. If, in this case, each macro RAM is equipped with the comparison/decision circuit so that the individual decide signals are independently outputted from the external terminals, the number of these external terminals will increase. In this embodiment, therefore, the decide signals are outputted as chip batch decide signals through the OR gate circuit.

Specifically, in the semiconductor integrated circuit device having the numerous macro RAMs mounted thereon, if any fail signal is outputted in case the plurality of RAMs are simultaneously tested, it can be outputted through the aforementioned OR gate circuit. In this case, what RAM has failed raises no problem because it can be found out by testing the macro RAMs one by one. This means that not only the plurality of macro RAMs are simultaneously tested, as described above, but also the macro RAMs can be individually tested to provide their decision results. In FIGS. 1 to 3, the portion excepting the logic circuit corresponds to the macro RAM.

Figure 5:
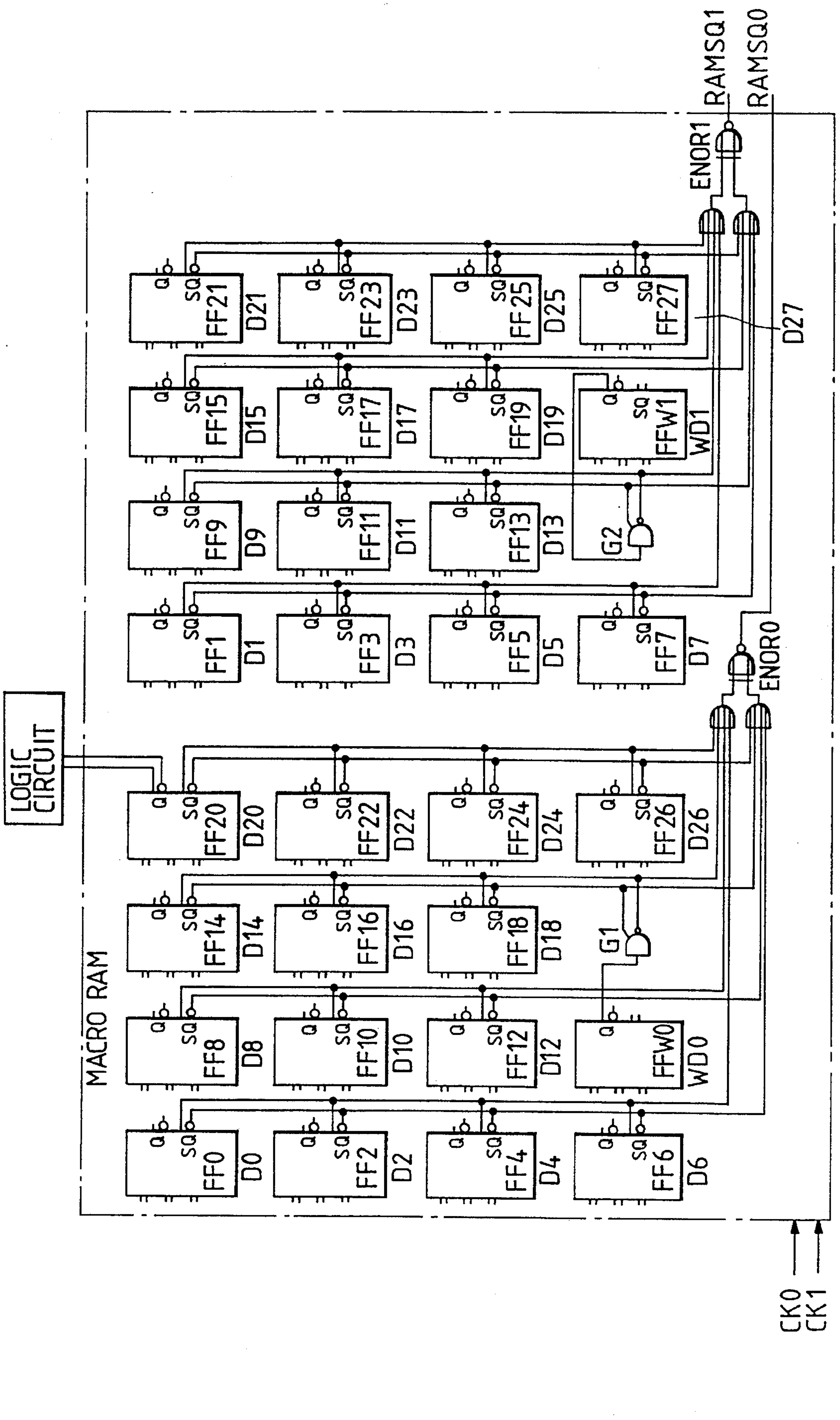
FIG. 5 is a circuit diagram showing another embodiment of the present invention.

FIG. 5 is a circuit diagram showing another embodiment of the present invention. This embodiment is exemplified by the case in which the present invention is applied to a RAM having a large data length. Specifically, this embodiment is exemplified by the case in which the memory access is carried out at the unit of 28 bits such as the data D0 to D2 to be latched in flip-flops FF0 to FF27.

In this embodiment, too, division is made into two groups so as to detect the interference between the adjoining bits or the adjoining circuits. That is to say, the even bits D0 to D26 and the odd bits D1 to D27. In this case, the fourteen outputs D0 to D26 and one expected value are given the wired OR construction. Then, the wired logic is taken among the four groups, namely: the first group of D0, D2, D4 and D6; the second group of D8, D10 and D12, and the expected value (i.e., the write data WD0) to be latched in the flip-flop FFW0; the third group of D14, D16 and D18; and the fourth group of D20, D22, D24 and D26, and is fed through the OR gate circuit to the exclusive OR circuit EOR1 to establish a decide output RAMSQ0. At the odd bits, too, the wired logic is taken by the four groups similar to the aforementioned ones, and the OR logic is taken by the gate circuit. These logics are fed to the exclusive OR circuit EOR2 to establish a decide output RAMSQ1.

In this embodiment, the expected values are to input the inverted signals. Accordingly, the output signals corresponding to the expected values are connected in the wired OR construction in which the non-inverted outputs and the inverted outputs are inverted. The reason why the expectation are inversely inputted is as follows.

If a failure should occur to establish the write state in the RAM at all times, the data written in the RAM are outputted therefrom as they are. In other words, the write inputs and the expected values are outputted through the RAM so that the pass signals are always produced. According to the method in which the inverted signals are inputted as the expected values for the write data, on the contrary, if a failure occurs to establish the write state although the aforementioned reading operation has been instructed, the expected values are inverted from the write data so that the fail signal is outputted. Thus, a highly reliable decision result can be achieved by the afore mentioned simple construction in which the expected values are inverted and inputted to adjust the level by the reversed connection in the wired logics.

In FIG. 5, only the outputs Q and /Q of the flip-flop FF20 are coupled to the logic circuit so as to observe the drawing easily, but the remaining flip-flops FF0 to FF19, and FF21 to FF27 also have their outputs Q and /Q coupled to the logic circuit.

Figure 6:
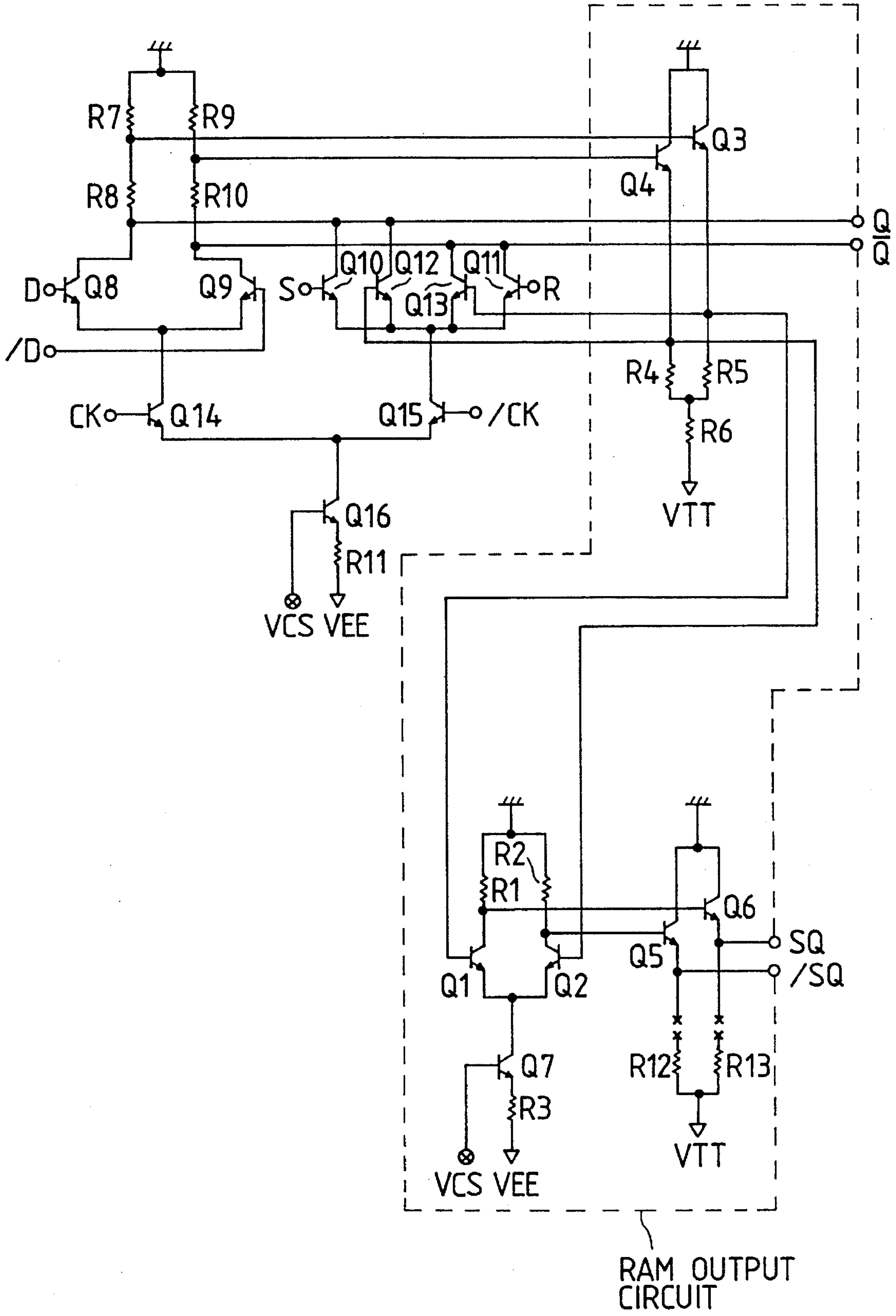
FIG. 6 is a specific circuit diagram showing one embodiment of the data-out latch which is disposed in the packaged RAM of the semiconductor integrated circuit device according to the present invention.

FIG. 6 is a specific circuit diagram showing one embodiment of the date-out latch to be mounted in the memory circuit RAM described above. The date-out latch of this embodiment is constructed of a D type flip-flop circuit having the ECL construction. Complementary read signals (i.e., the data-in latch holding signals) D and /D from the sense amplifier are fed to the bases of the differential transistors Q8 and Q9. These differential transistors Q8 and Q9 have their collectors equipped with load resistors R7 and R8, and R9 and R10. The collector outputs of the differential transistors Q8 and Q9 are transmitted as they are as the ECL output signals Q and /Q to the bases of the not-shown emitter-follower output transistors.

The level-shifted output signals obtained from the nodes of the aforementioned load resistors R7 and R8, and R9 and R10 are fed to the bases of the transistors Q3 and Q5. These transistors Q3 and Q4 have their emitters equipped with the emitter resistors R4 and R5 and their shared resistor R6 and connected with the supply terminal VTT.

The emitter-follower outputs of the aforementioned transistors Q3 and Q4 are fed to the bases of feedback inputting differential transistors Q12 and Q13. The collectors of these transistors Q12 and Q13 are crossly connected with the collectors of the aforementioned inputting differential transistors Q8 and Q9. In short, the collector outputs of the aforementioned differential transistors Q12 and Q13 are so connected that they are positively fed back through the aforementioned transistors Q3 and Q4. The aforementioned feedback transistors Q12 and Q13 are equipped with a transistor Q10 made receptive of a set signal S and a transistor Q11 made receptive of a reset signal R.

The aforementioned inputting transistors Q8 and Q9 have their emitters connected with the collector of a transistor Q14 which has its base fed with a non-inverted clock signal CK. The aforementioned feedback transistors Q12 and Q13 and setting/resetting transistors Q10 and Q11 have their emitters equipped with a transistor Q15 which is fed with an inverted clock signal /CK. The transistors Q14 and Q15 to be fed with the aforementioned clock signals CK and /CK are given a differential mode and have their shared emitters equipped with a constant current source. This constant source is composed of a transistor Q16 having its base fed with the constant voltage VCS and an emitter resistor R11 for the transistor Q16.

The aforementioned latch circuit performs the through/latch operations. Specifically, when the clock signal CK is at the high level, the input differential transistors Q8 and Q9 are validated to output signals corresponding to the input signals D and /D. On the contrary, when the clock signal CK takes the low level whereas the clock signal /CK takes the high level, the differential transistors Q10 to Q13 at the feedback side are validated to latch the aforementioned latched data if the set signal S and the reset signal R are at the low level. If, at this time, the signal S is raised to the high level, a signal corresponding to the aforementioned latched data is outputted in place. If the signal R is raised to the high level, a signal corresponding to the aforementioned latched data is outputted in place.

In this embodiment, as the testing output circuit, the output signals of the aforementioned transistors Q3 and Q4 are fed to the differential transistors Q1 and Q2. These differential transistors Q1 and Q2 have their collectors equipped with the load resistors R1 and R2. The differential transistors Q1 and Q2 are equipped at their common emitter with a constant current source composed of the transistor Q7 and the resistor R3.

The outputs of the unit circuit thus having the ECL construction are outputted as testing complementary signals SQ and /SQ through the emitter-follower output transistors Q5 and Q6. The emitter load resistors R1 and R2 are connected with one of the plurality of circuits having the connection of the wired OR construction. The selective connection of those load resistors is made by the master slice method.

The following operations and effects can be attained from the embodiments thus far described.

(1) The read signals to be outputted at the unit of the plurality of bits from the packaged RAM are received to produce the complementary output signals, and these output signals and the non-inverted and inverted signals of the expected values are individually inputted to the deciding logic circuits, so that the outputs of the two deciding logic circuits are compared by the coincidence/incoincidence circuit to produce the decide output. As a result, there can be attained effects that the output signals from the RAM can be decided at the unit of the plurality of bits in a batch together with the expected values, and that the semiconductor integrated circuit device can be constructed with only one diagnosis output pin.

(2) The signals to be outputted at the unit of the aforementioned bits are divided into the two for the physically adjoining signal output paths, and the first and second logic circuits and the first and second coincidence/incoincidence circuits are individually provided for the first and second expected values. As a result, there can be attained an effect that it is possible to achieve the decide result of the interference of adjoining bits.

(3) The memory cells of the RAM are constructed of the CMOS circuit, and the input/output interfaces is made interchangeable with the ECL circuit so that the wired logic may be utilized by making use of the emitter-follower outputs of the ECL circuit. As a result, there can be attained an effect that the circuit can be so drastically simplified while reducing the power consumption that the comparison/decision circuits can be constructed substantially of the exclusive OR circuits.

(4) The plurality of aforementioned RAMs are equipped with the aforementioned output circuits, logic circuits and coincidence/incoincidence circuits, the output signals of which are outputted through the logic circuits from one external terminal. As a result, there can be attained an effect that the number of diagnosis output terminals can be reduced.

(5) The aforementioned expected values are returned at the side of the logic circuits by inputting their inverted ones. As a result, there can be attained an effect that it is possible to detect the RAM failure which might otherwise invite the write state at all times.

Although our invention has been specifically described in connection with its embodiments, it should not be limited thereto but can naturally be modified in various manners without departing from the gist thereof. For example, all the RAMs may be given the ECL construction or the CMOS construction. In the CMOS construction, the testing output circuits are made to have the open drain construction in which the connections are made by the wired ORs to simplify the circuit. Alternatively, the circuit for deciding the all 0 or all 1 from the corresponding ones of the testing complementary signals may be exemplified by an OR gate circuit, a NOR gate circuit, an AND gate circuit or a NAND gate circuit. The coincidence/incoincidence circuits should not be limited to the exclusive OR circuits but may be any if they can detect the coincidence/incoincidence.

The RAMs should not be limited to the gate arrays, as packaged in the semiconductor integrated circuit device, but may be the semiconductor integrated circuit devices themselves, as have their memories accessed at the unit of a plurality of bits such as 8 bits or 16 bits. The present invention can be widely applied to the semiconductor integrated circuit device including the various RAMs.

The effects to be obtained by the representative of the invention disclosed herein will be briefly described in the following. Specifically, the read signals to be outputted at the unit of the plurality of bits from the packaged RAM are received to produce the complementary output signals, and these output signals and the non-inverted and inverted signals of the expected values are individually inputted to the deciding logic circuits, so that the outputs of the two deciding logic circuits are compared by the coincidence/incoincidence circuit to produce the decide out put. As a result, the output signals from the RAM can be decided at the unit of the plurality of bits in a batch together with the expected values, and the semiconductor integrated circuit device can be constructed with only one diagnosis output pin.

The signals to be outputted at the unit of the aforementioned bits are divided into the two for the physically adjoining signal output paths, and the first and second logic circuits and the first and second coincidence/incoincidence circuits are individually provided for the first and second expected values. As a result, it is possible to achieve the decide result of the interference of adjoining bits.

The memory cells of the RAM are constructed of the CMOS circuit, and the input/output interfaces is made interchangeable with the ECL circuit so that the wired logic may be utilized by making use of the emitter-follower outputs of the ECL circuit. As a result, the circuit can be so drastically simplified while reducing the power consumption that the comparison/decision circuits can be constructed substantially of the exclusive OR circuits.

The plurality of aforementioned RAMs are equipped with the aforementioned output circuits, logic circuits and coincidence/incoincidence circuits, the out put signals of which are outputted through the logic circuits from one external terminal. As a result, the number of diagnosis output terminals can be reduced.

The aforementioned expected values are returned at the side of the logic circuits by inputting their inverted ones. As a result, it is possible to detect the RAM failure which might otherwise invite the write state at all times.

What is claimed is:

1. A semiconductor integrated circuit device comprising:

a plurality of complementary data lines each of which is coupled to a memory cell and each of which includes an inverted data line and a non-inverted data line;

a selector circuit for substantially simultaneously selecting predetermined ones of said plurality of complementary data lines;

an expected data providing circuit which provides expected inverted data and expected non-inverted data; and a decision circuit coupled to the expected data providing circuit and to the complementary data lines which are simultaneously selected by said selector circuit and including a first circuit which decides whether or not data on inverted data lines of the complementary data lines selected by the selector circuit coincide with the expected inverted data and a second circuit which decides whether or not data on non-inverted data lines of the complementary data lines are selected by the selector circuit coincide with the expected non-inverted data.

2. A semiconductor integrated circuit device according to claim 1, further comprising:

a common complementary data line pair having an inverted data line and a non-inverted data line, wherein the inverted data line of each of said plurality of complementary data lines is coupled to the inverted data line of said common complementary data line pair whereas the non-inverted data line of each of said plurality of complementary data lines is coupled to the non-inverted data line of said common complementary data line pair.

3. A semiconductor integrated circuit device according to claim 2, wherein said first circuit is coupled to the inverted data line of said common complementary data line pair and said second circuit is coupled to the non-inverted data line of said common complementary data line pair.

4. A semiconductor integrated circuit device according to claim 2, wherein said expected data providing circuit includes a latch circuit coupled to said common complementary data line pair through the inverted data line and the non-inverted data line for latching the expected inverted data line and the expected non-inverted data.

5. A semiconductor integrated circuit comprising:

a logic circuit;

a memory coupled to said logic circuit and including a first memory block and a second memory block being adjacent to the first memory block, each of the first and second memory blocks including:

a plurality of complementary data lines each of which is coupled to a memory cell and each of which includes an inverted data line and a non-inverted data line; and a selector circuit for selecting one from said plurality of complementary data lines, a first expected data providing circuit which provides first expected inverted data and first expected non-inverted data;

a second expected data providing circuit which provides second expected inverted data and second expected non-inverted data;

a first decision circuit coupled to the first expected data providing circuit and to the first memory block, and including a first circuit which decides whether or not data on the inverted data line of the complementary data line which is selected by the selector circuit and which is included in the first memory block, coincides with the first expected inverted data and a second circuit which decides whether or not data on the non-inverted data line of the complementary data line which is selected by the selector circuit and which is included in the first memory block, coincides with the first expected non-inverted data; and a second decision circuit coupled to the second expected data providing circuit and to the second memory block, and including a first circuit which decides whether or not data on the inverted data line of the complementary data line which is selected by the selector circuit and which is included in the second memory block, coincide with the second expected inverted data, and a second circuit which decides whether or not data on the non-inverted data line of the complementary data line which is selected by the selector circuit and which is included in the second memory block, coincides with the second expected non-inverted data.

6. A semiconductor integrated circuit according to claim 5, wherein the memory includes a word line coupled to the memory cells.

7. A semiconductor integrated circuit according to claim 6, wherein each of the memory cells is a static memory cell.

8. A semiconductor integrated circuit according to claim 7, further comprising an external terminal and test circuit which provides a test signal to the external terminal in accordance with signals from the first decision circuit and the second decision circuit.

9. A semiconductor integrated circuit device according to claim 2, wherein each of said memory cells is a static memory cell.

10. A semiconductor integrated circuit according to claim 5, wherein said memory further comprises a third memory block and a fourth memory block being adjacent to the third memory block, each of the third and fourth memory blocks including:

a plurality of complementary data lines each of which is coupled to a memory cell and each of which includes an inverted data line and a non-inverted data line; and a selector circuit for selecting one from said plurality of complementary data lines, wherein said first circuit in the first decision circuit decides whether or not data on inverted data lines of the complementary data lines, which are selected by the selector circuit and which are included in the first memory block and the third memory block, coincide with the first expected inverted data, and said second circuit in the first decision circuit decides whether or not data on non-inverted data lines of the complementary data lines, which are selected by the selector circuit and which are included in the first memory block and the third memory block, coincide with the first expected non-inverted data, and wherein said first circuit in said second decision circuit decides whether or not data on inverted data lines of the complementary data lines which are selected by the selector circuit and which are included in the second memory block and the fourth memory block, coincide with the second expected inverted data, and said second circuit in the second decide circuit decides whether or not data on non-inverted data lines of the complementary data lines which are selected by the selector circuit and which are included in the second memory block and the fourth memory block, coincide with the second expected non-inverted data.

11. A semiconductor integrated circuit according to claim 10, wherein the memory includes a word line coupled to the memory cells.

12. A semiconductor integrated circuit according to claim 11, wherein each of memory cells is a static memory cell.

13. A semiconductor integrated circuit according to claim 12, wherein the second memory block is adjacent to the third memory block.

14. A semiconductor integrated circuit according to claim 13, further comprising an external terminal and test circuit which provides a test signal to the external terminal in accordance with signals from the first decision circuit and the second decision circuit.

15. A semiconductor integrated circuit device according to claim 1, wherein the memory cells simultaneously selected by said selector circuit are individually coupled to a word line.

16. A semiconductor integrated circuit device according to claim 4, further comprising:

a plurality of memory blocks each including complementary data lines, and at least two decision circuits coupled to said memory blocks, wherein complementary data lines of each of said memory blocks are coupled to one of said decision circuits which is different from the decision circuit which is coupled to the complementary data lines of the adjoining memory block.

17. A semiconductor integrated circuit device according to claim 15, wherein at least two latch circuits for latching the expected data are provided, and wherein one of said at least two decision circuits is fed with the expected data from one of said at least two latch circuits whereas the other of said at least two decision circuits is fed with the expected data from the other of said at least two latch circuits.

* * * * *